(12) United States Patent
Hwang et al.

(10) Patent No.: US 9,664,764 B2
(45) Date of Patent: May 30, 2017

(54) MAGNETIC RESONANCE IMAGING APPARATUS AND SUSCEPTIBILITY-WEIGHTED IMAGING METHOD USING THE SAME

(71) Applicants: Samsung Electronics Co., Ltd., Gyeonggi-do (KR); The Trustees of the University of Pennsylvania, Philadelphia, PA (US)

(72) Inventors: Jin Young Hwang, Gyeonggi-do (KR); Joon Soo Kim, Seoul (KR); Jae Moon Jo, Gyeonggi-do (KR); Yang Lim Choi, Gyeonggi-do (KR); Jongho Lee, Ulsan (KR)

(73) Assignees: Samsung Electronics Co., Ltd., Yeongtong-gu, Suwon-si, Gyeonggi-do (KR); The Trustees Of The University Of Pennsylvania, Philadelphia, PA (US)

( * ) Notice: Subject to any disclaimer, the term of this patent is extended or adjusted under 35 U.S.C. 154(b) by 621 days.

(21) Appl. No.: 14/167,152

(22) Filed: Jan. 29, 2014

(65) Prior Publication Data

US 2014/0210467 A1     Jul. 31, 2014

Related U.S. Application Data

(60) Provisional application No. 61/758,397, filed on Jan. 30, 2013.

(30) Foreign Application Priority Data

Jun. 11, 2013    (KR) ........................ 10-2013-0066229

(51) Int. Cl.
  *G01R 33/56*    (2006.01)
  *G01R 33/565*   (2006.01)
  *G01R 33/561*   (2006.01)

(52) U.S. Cl.
  CPC ......... *G01R 33/56* (2013.01); *G01R 33/5602* (2013.01); *G01R 33/56536* (2013.01); *G01R 33/5615* (2013.01)

(58) Field of Classification Search
  CPC .............. G01R 33/56; G01R 33/5602; G01R 33/56536; G01R 33/5615; A61B 5/055;
  (Continued)

(56) References Cited

U.S. PATENT DOCUMENTS

2008/0071167 A1*  3/2008  Ikedo ............... G01R 33/56545
                                                                600/419
2011/0275926 A1*  11/2011  Du ..................... G01R 33/5635
                                                                600/410
(Continued)

FOREIGN PATENT DOCUMENTS

JP    2007-68996 A    3/2007
JP    2011-81786 A    4/2011
(Continued)

OTHER PUBLICATIONS

SIPO Office Action.*
(Continued)

Primary Examiner — Clayton E Laballe
Assistant Examiner — Ruifeng Pu
(74) Attorney, Agent, or Firm — Cha & Reiter, LLC

(57) ABSTRACT

An MRI system acquires a susceptibility-weighted image by acquiring a first RF echo signal in a first echo time for providing an image exclusive of susceptibility-weighting and acquiring a second RF echo signal in a second echo time longer than the first echo time for providing an image including susceptibility-weighting. A compensation gradient field is applied for compensating for field inhomogeneity and in response, a third RF echo signal is acquired in a third echo time longer than the second echo time. First, second
(Continued)

and third images are generated in response to data derived from the first, second and third RF echo signals respectively and data of the first, second and third images is combined to provide image data representing an image compensating for magnetic resonance signal attenuation in the second image.

27 Claims, 13 Drawing Sheets

(58) Field of Classification Search
CPC ............ A61B 2576/026; A61B 5/0042; A61B 5/0059; A61B 5/0536; A61B 5/4842; A61B 5/4848
See application file for complete search history.

(56) References Cited

U.S. PATENT DOCUMENTS

| | | | | |
|---|---|---|---|---|
| 2012/0068703 | A1* | 3/2012 | Gross | G01R 33/50 324/309 |
| 2015/0108976 | A1* | 4/2015 | Fischer | G01R 33/5616 324/309 |
| 2015/0145514 | A1* | 5/2015 | Sharma | G01R 33/4828 324/309 |
| 2016/0109539 | A1* | 4/2016 | Mardor | G01R 33/5608 600/420 |
| 2016/0174919 | A1* | 6/2016 | Ahn | G01T 1/1603 382/131 |

FOREIGN PATENT DOCUMENTS

| | | |
|---|---|---|
| JP | 2012-521841 A | 9/2012 |
| KR | 10-2011-0025413 A | 3/2011 |

OTHER PUBLICATIONS

KIPO Office Action.*
Gasparotti et al, New MR Sequences in daily practice: susceptibility weighted imaging. A pictoral essay.*

* cited by examiner

MAGNETIC RESONANCE IMAGING APPARATUS AND SUSCEPTIBILITY-WEIGHTED IMAGING METHOD USING THE SAME

CLAIM OF PRIORITY

This application claims the benefits of U.S. Patent Application No. 61/758,397 filed on Jan. 30, 2013 in USPTO and Korean Patent Application No. 10-2013-0066229, filed on Jun. 11, 2013 in the Korean Intellectual Property Office, the disclosures of which are incorporated herein by references.

BACKGROUND

1. Field

A magnetic resonance imaging (MRI) system is concerned with diagnosing various diseases using a magnetic resonance image, and a susceptibility-weighted imaging (SWI) method.

2. Description of the Related Art

A medical imaging system acquires image information concerning a patient. Medical imaging systems include an X-ray apparatus, an ultrasonic diagnostic apparatus, a computed tomography (CT) apparatus and an MRI apparatus for example. An MRI apparatus provides a relatively flexible image capturing method, with improved contrast in soft tissue, provides various diagnostic information images, and is of value in diagnosis using medical images. A magnetic resonance image is acquired by imaging the density and chemicophysical property of atomic nuclei when nuclear magnetic resonance of hydrogen nuclei in the human body is caused using a magnetic field that is harmless to the human body and results in a radio frequency (RF) signal comprising non-ionizing radiation.

An MRI apparatus provides a predetermined frequency and energy to atomic nuclei within a predetermined magnetic field, thereby converting energy emitted from the nuclei into a signal used for imaging the inside of the human body. Protons within an atomic nucleus have individual spin angular momentums and magnetic dipoles. Thus, when a magnetic field is applied to the protons, the protons are arranged in the direction of the magnetic field, and the nucleus undergoes a precessional motion about the direction of the magnetic field.

Difference in magnetic susceptibility between pieces of body tissue are indicated by the degree of contrast between the pieces of body tissue associated with the longitudinal (or spin-lattice) relaxation time T1 decay constant, the transverse (or spin-spin) relaxation time T2 decay constant for a proton spin component or a proton density-weighted image. A method of acquiring an image in which difference in the degree of contrast between pieces of tissue is emphasized using such susceptibility difference is referred to as SWI (Susceptibility-Weighted Imaging). When susceptibility is weighted using a long time echo (TE), an artifact is included in a susceptibility-weighted image due to signal attenuation that may occur at an air cavity included in human body, for example, the nose or an ear.

SUMMARY

A magnetic resonance imaging system provides a susceptibility-weighted imaging (SWI) method for acquiring a susceptibility-weighted image by compensating a signal attenuation region of an echo signal acquired in a time echo (TE) for acquiring the susceptibility-weighted image using an echo signal acquired in another TE.

An MRI system acquires a susceptibility-weighted image by acquiring a first RF echo signal in a first echo time for providing an image exclusive of susceptibility-weighting and acquiring a second RF echo signal in a second echo time longer than the first echo time for providing an image including susceptibility-weighting. A compensation gradient field is applied for compensating for field inhomogeneity and in response, a third RF echo signal is acquired in a third echo time longer than the second echo time. First, second and third images are generated in response to data derived from the first, second and third RF echo signals respectively and data of the first, second and third images is combined to provide image data representing an image compensating for magnetic resonance signal attenuation in the second image. The first, second and third RF echo signals are acquired within a single repetition time (TR) between successive RF excitation pulses.

In a feature, first, second and third magnitude images are derived from the first, second and third images respectively, and first and second phase images are derived from the first and second images. The method identifies a first region of the first, second and third magnitude images, acquires a magnitude image of the identified first region and calculates a magnitude image of a second region excluding the first region in response to the second magnitude image. The method includes thresholding the second phase image to acquire a fourth image for use in processing the first region and a second region excluding the first region of the second phase image and identifying the first region using the first, second and third magnitude images and the fourth image. A magnitude image of the second region is acquired using the second magnitude image and the fourth image. The magnitude image of the first region and the magnitude image of the second region are combined to acquire a fourth magnitude image compensated for signal attenuation.

In another feature, the method includes, acquiring a first phase mask for the first region using the first phase image and the fourth image, acquiring a second phase mask for the second region using the second phase image and the fourth image and combining the first phase mask and the second phase mask to acquire a third phase mask compensated for signal attenuation. The first phase mask and the second phase mask are acquired by, performing Laplacian unwrapping on each of the first phase image and the second phase image to provide unwrapped images, performing Gaussian filtering on each of the unwrapped first phase image and the second phase image and performing homodyne filtering on each of the unwrapped, Gaussian filtered first phase image and the second phase image. The method combines the fourth magnitude image compensated for signal attenuation and the third phase mask compensated for signal attenuation to acquire the susceptibility-weighted image compensated for signal attenuation. The first region includes a region in which signal attenuation has been caused by susceptibility weighting associated with an air cavity.

In another feature, a method acquires a susceptibility-weighted image for use by a magnetic resonance imaging (MRI) system by, acquiring a first RF echo signal in a first echo time for providing an image exclusive of susceptibility-weighting, acquiring a second RF echo signal in a second echo time longer than the first echo time for providing an image including susceptibility-weighting and acquiring a third RF echo signal in a third echo time longer than the second echo time. The method derives data representing first, second and third images from the first, second and third echo signals respectively, and identifies a first region in which signal attenuation has occurred in the second image using the acquired first, second and third images. Data representing the first, second and third images is combined to compensate the estimated first region. The first, second and third RF echo signals are acquired within a single repetition time (TR) between successive RF excitation pulses.

In yet another feature, a magnetic resonance imaging (MRI) apparatus, comprises a radio frequency (RF) coil configured to, acquire a first RF echo signal in a first echo time for providing an image exclusive of susceptibility-weighting; acquire a second RF echo signal in a second echo time longer than the first echo time for providing an image including susceptibility-weighting and acquire a third RF echo signal in a third echo time longer than the second echo time. An image processing unit is configured to, derive data representing first, second and third images from the first, second and third echo signals respectively, identify a first region in which signal attenuation has occurred in the second image using the acquired first, second and third images, and compensate for attenuation of magnetic resonance signal in the identified first region by combining data of the first, second and third images. The first, second and third RF echo signals are acquired within a single repetition time (TR) between successive RF excitation pulses.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
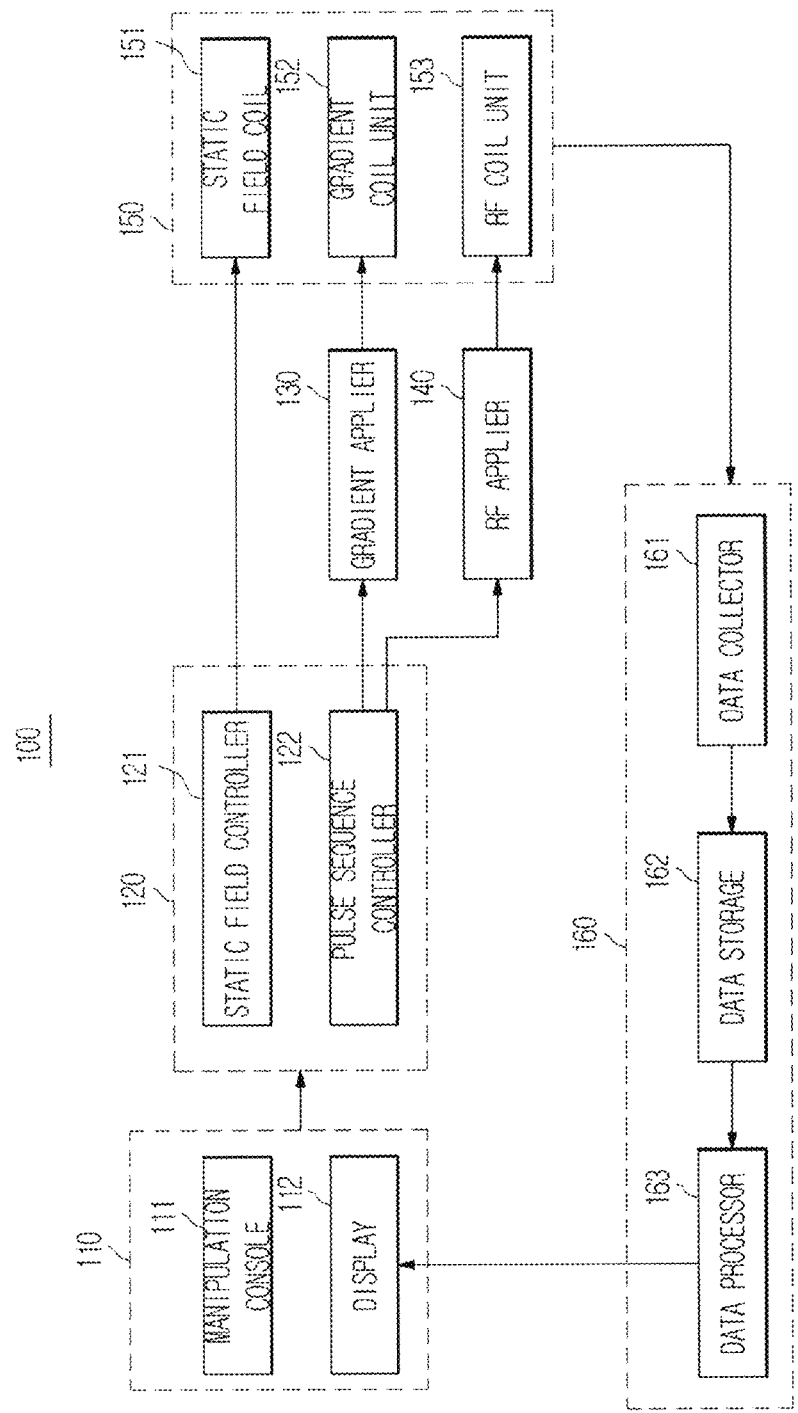
FIG. 1 shows a magnetic resonance imaging (MRI) apparatus according to invention principles.

Reference will now be made in detail to the embodiments of the present invention, examples of which are illustrated in the accompanying drawings, wherein like reference numerals refer to like elements throughout.

FIG. 1 shows a magnetic resonance imaging (MRI) system 100 including a bore 150 that forms a magnetic field and induces resonance in atomic nuclei, a coil control unit 120 that controls operation of coils within the bore 150, an image processing unit 160 that receives an echo signal generated from the nuclei and generates a magnetic resonance image and a workstation 110 that controls overall operation of the MRI apparatus 100. The bore 150 includes a static field coil 151 that forms a static magnetic field, a gradient coil unit 152 that forms a gradient field within the static field, and a radio frequency (RF) coil unit 153 that excites the nuclei and receives the echo signal from the nuclei. The coil control unit 120 includes a static field controller 121 that controls the magnitude and direction of the static field formed by the static coil 151, and a pulse sequence controller 122 that determines a pulse sequence and controls the gradient coil unit 152 and the RF coil unit 153. A gradient applier 130 applies a gradient signal to the gradient coil unit 152, and an RF applier 140 that applies an RF signal to the RF coil unit 153.

The pulse sequence controller 122 controls the gradient applier 130 and the RF applier 140, to adjust an RF signal, RF field and gradient field. Furthermore, the workstation 110 enables an operator of the MRI apparatus 100 to manipulate the equipment, and receive a control command for overall operation of the MRI apparatus 100 from the operator. The workstation 110 includes a manipulation console 111 that enables an operator to manipulate the system, and a display 112 that presents a control state and an image generated by the image processing unit 160 for user diagnosis of a target body 200 (FIG. 2).

Figure 2:
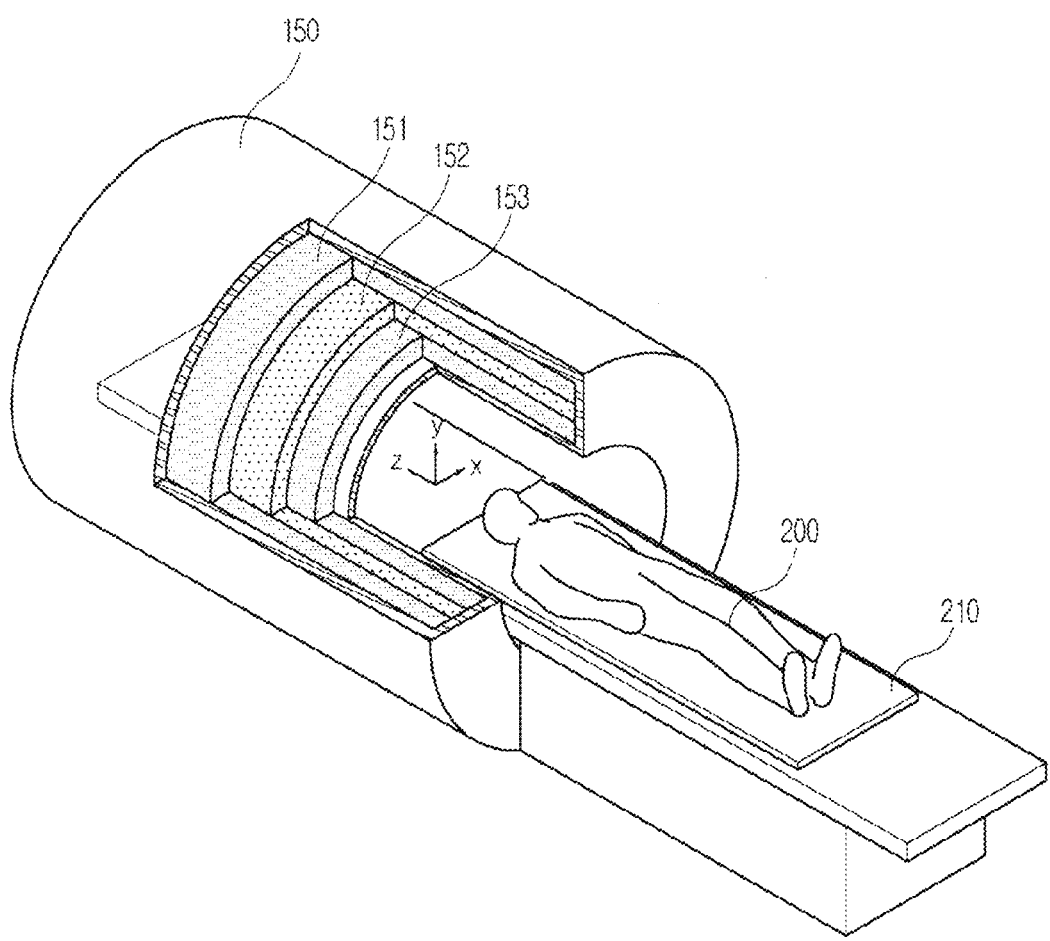
FIG. 2 shows an MRI apparatus according to invention principles.
Figure 3:
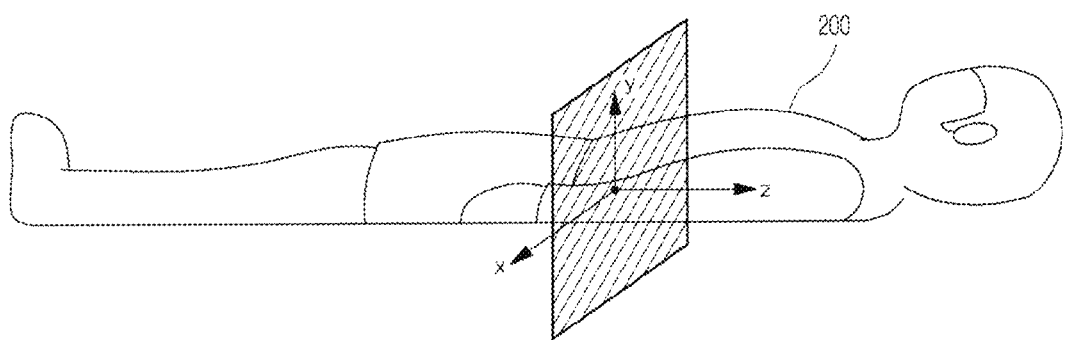
FIG. 3 shows a view of space in which a target body is placed and associated x, y and z axes according to invention principles.
Figure 4:
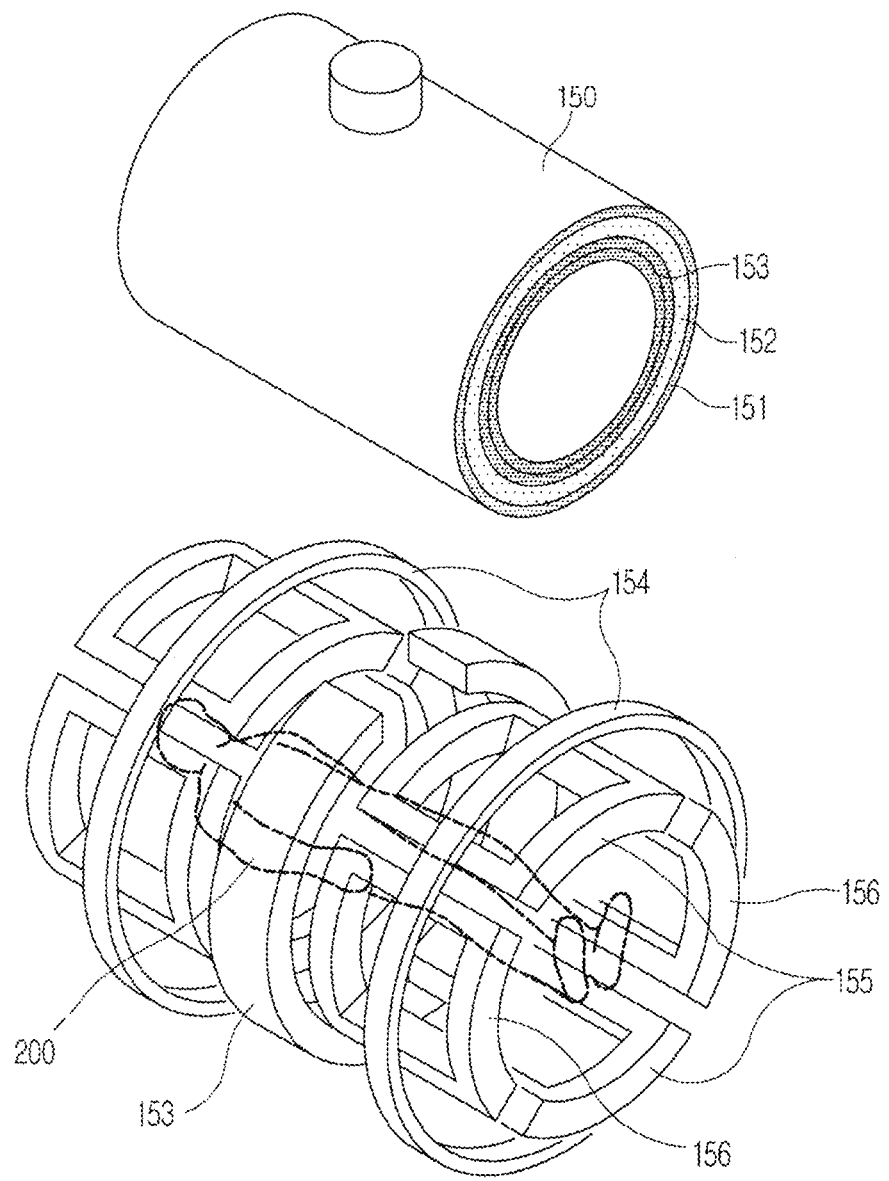
FIG. 4 shows a structure of a bore and a structure of a gradient coil unit according to invention principles.
Figure 5:
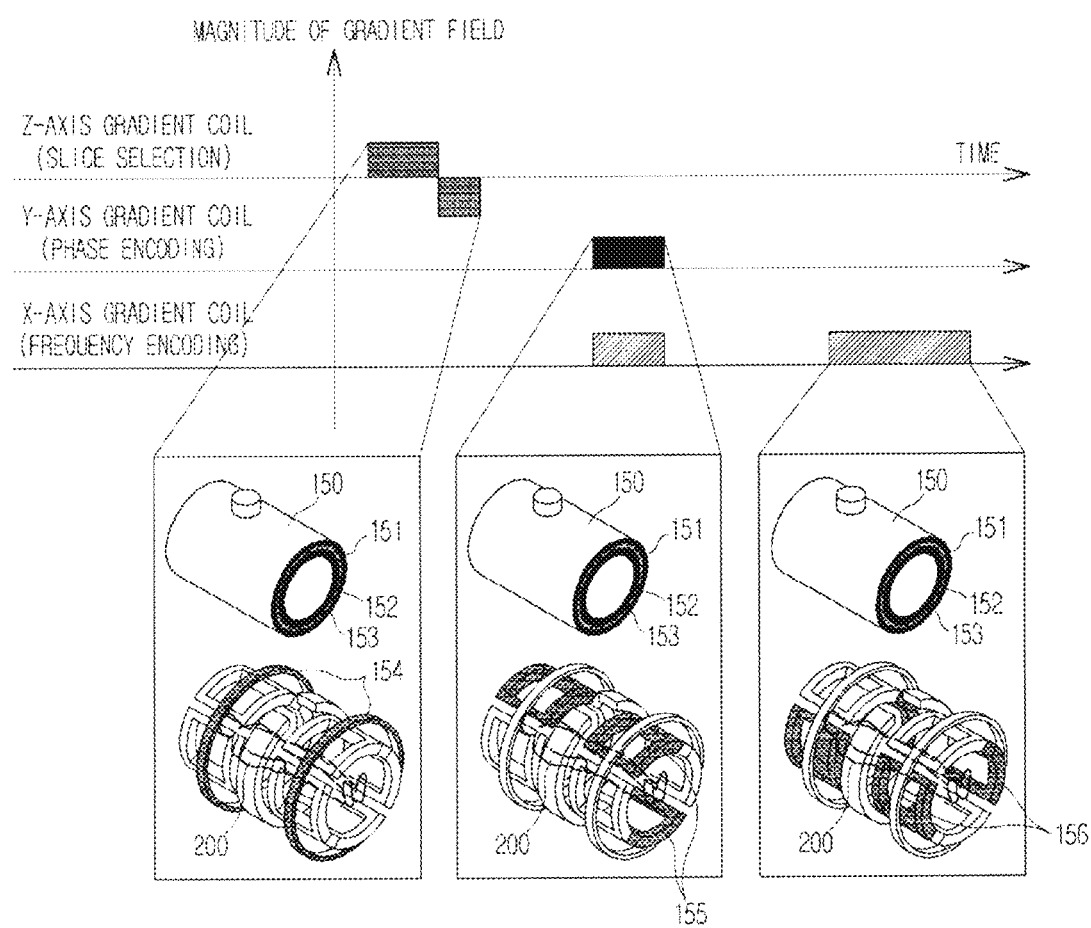
FIG. 5 shows respective gradient coils comprising a gradient coil unit, and a pulse sequence relating to operation of the respective gradient coils according to invention principles.

FIG. 2 shows an MRI apparatus, and FIG. 3 shows a space in which a target body is placed associated with x, y and z axes. FIG. 4 shows a structure of a bore and a structure of a gradient coil unit, FIG. 5 shows respective gradient coils comprising a gradient coil unit, and a pulse sequence relating to operation of the respective gradient coils.

Detailed operation of the MRI system is described with reference to FIG. 1 described above and FIG. 2 to FIG. 5. The bore 150 has a cylindrical shape with an empty inner space referred to as a cavity. A conveyor 210 conveys the target body 200 lying thereon to the cavity. The bore 150 includes the static field coil 151, the gradient coil unit 152, and the RF coil unit 153. The static coil 151 is wound around the cavity, and when current is applied to the static coil 151, a static field is formed in the bore 150, that is, the cavity. In general, the direction of the static field is parallel to an axis of the bore 150.

In response to a static field being formed in the cavity, nuclei of atoms, in particular, hydrogen atoms, comprising the target body 200 are arranged in the direction of the static field, and undergo a precessional motion about the direction of the static field. A precession rate of nuclei is presented as a precession frequency, which is referred to as a Larmor frequency and is expressed as [Equation 1] below.

$$\omega = \gamma B_0 \qquad \text{[Equation 1]}$$

Here, ω is a Larmor frequency, γ is a proportional constant, and $B_0$ is a strength of an external magnetic field. The proportional constant varies according to the type of nuclei, a unit of the strength of an external magnetic field is tesla (T) or gauss (G), and a unit of a precession frequency is Hz. For example, a hydrogen proton has a precession frequency of 42.58 MHz in an external magnetic field, and among atoms comprising human body, hydrogen atoms have the largest ratio. Thus, an MRI apparatus obtains a magnetic resonance signal by mainly using a precessional motion of hydrogen protons. The gradient coil unit 152 causes the static field formed in the cavity to incline, thereby forming a gradient magnetic field.

As shown in FIG. 3, an axis parallel to a direction from the head of the target body 200 to the feet, that is, an axis parallel to the direction of the static field, is a z axis, an axis parallel to a direction between the left side and the right side of the target body 200 is an x axis, and an axis parallel to a vertical direction in the space is a y axis. Gradient fields with respect to the x, y and z axes are used to obtain three dimensional (3D) spatial information. Thus, the gradient coil unit 152 includes three pairs of gradient coils.

As shown in FIG. 4 and FIG. 5, z-axis gradient coils 154 comprise a pair of ring-shaped coils, and y-axis gradient coils 155 are disposed above and below the target body 200. X-axis gradient coils 156 are disposed on the left and right sides of the target body 200. When direct currents having opposite polarities flow in opposite directions in the two z-axis gradient coils 154, a change in magnetic field occurs in a z-axis direction, and a gradient field is formed. FIG. 5 shows a pulse sequence used for forming a z-axis gradient field upon using the z-axis gradient coils 154. The z-axis gradient coils 154 are used for slice selection. Here, the higher the gradient of a gradient field formed in the z-axis direction, the thinner the slice that can be selected. When a slice is selected using the gradient field formed by the z-axis gradient coils 154, spins comprising the slice have the same frequency and phase, and thus it is impossible to discriminate between their respective spins.

A gradient field formed in a y-axis direction by the y-axis gradient coils 155, causes a phase shift, such that rows of the slice have different phases. Thereby, phases of spins of a row to which a large gradient field is applied are shifted to a high frequency, and phases of spins of a row to which a small gradient field is applied are shifted to a lower frequency. When the y-axis gradient field disappears, the respective rows of the selected slice are subjected to a phase shift having different phases, and thus can be distinguished. As described above, the gradient field formed by the y-axis gradient coils 155 is used for phase encoding. FIG. 5 shows a pulse sequence used for forming a y-axis gradient field upon using the y-axis gradient coils 155.

A slice is selected through the gradient field formed by the z-axis gradient coils 154, and rows comprising the selected slice are distinguished through a gradient field formed by the y-axis gradient coils 155 with different phases. However, respective spins comprising a row have the same frequency and phase, and thus it is impossible to discriminate between their respective spins. If a gradient field is formed in an x-axis direction by the x-axis gradient coils 156, the gradient field causes respective spins comprising a row to have different frequencies, such that the respective spins can be distinguished. In this way, the gradient field formed by the x-axis gradient coils 156 is used for frequency encoding.

As described above, gradient fields formed by z, y and x axis gradient coils are used for slice selection, phase encoding, and frequency encoding, and spatial positions of respective spins are encoded. The gradient coil unit 152 is connected with the gradient applier 130, and the gradient applier 130 applies a driving signal to the gradient coil unit 152 in response to a control signal received from the pulse sequence controller 122, thereby forming gradient fields. The gradient applier 130 has three driving circuits corresponding to the three pairs of gradient coils 154, 155 and 156 comprising the gradient coil unit 152. Nuclei arranged by an external magnetic field undergo a precessional motion at the Larmor frequency, and the sum of magnetization vectors of several nuclei is expressed using one net magnetization M. An RF pulse tuned to the Larmor frequency is applied to the static field to excite the nuclei. A resultant $M_{xy}$ component net magnetization magnetic resonance signal present on an XY is detected. The RF coil unit 153 includes a transmission coil that transmits an RF pulse, and a reception coil that receives an electromagnetic wave emitted by the excited nuclei, as a magnetic resonance signal. The RF coil unit 153 is connected to the RF applier 140, and the RF applier 140 applies a driving signal to the RF coil unit 153 in response to a control signal received from the pulse sequence controller 122.

The RF applier 140 includes a modulation circuit that modulates a high-frequency output signal into a pulse signal, and an RF power amplifier that amplifies the pulse signal. Also, the RF coil unit 153 is connected to the image processing unit 160, and the image processing unit 160 includes a data collector 161 that receives the magnetic resonance signal received by the RF coil unit 153 and processes the received magnetic resonance signal to generate data for generating a magnetic resonance image, and a data processor 163 that processes the data generated by the data collector 161 to generate a magnetic resonance image. The data collector 161 includes a preamplifier that amplifies the magnetic resonance signal received by the reception coil of the RF coil unit 153, a phase detector that receives the magnetic resonance signal from the preamplifier and performs phase detection, and an analog/digital (A/D) converter that converts an analog signal acquired through phase detection into a digital signal. The data collector 161 transmits the magnetic resonance signal converted into the digital signal to a data storage 162.

In the data storage 162, a data space comprising a two-dimensional (2D) Fourier space is formed. When storage of all data that has been completely scanned is finished, the data processor 163 performs a 2D inverse Fourier transform on data in the 2D Fourier space, thereby providing an image of the target body 200. The image is displayed on the display 112. A pulse sequence used to obtain a magnetic resonance signal from nuclei comprise a gradient echo pulse sequence. In the gradient echo pulse sequence, an RF pulse having a smaller flip angle than 90° is applied. When the RF pulse is applied, a free induction decay (FID) signal is generated. Unlike a spin echo pulse sequence, the gradient pulse sequence does not wait for dephasing of the FID signal, but forcibly dephases the FID signal using a dephasing gradient. Also, while the spin echo sequence applies an RF pulse having a flip angle of 180° to obtain an echo signal, the gradient pulse sequence applies a rephasing gradient. The gradient pulse sequence does not use an RF pulse having a flip angle of 180°, unlike the spin echo sequence, but uses a single RF pulse having a smaller flip angle than 90°, and thus is more sensitive to a magnetic susceptibility artifact than the spin echo pulse sequence.

Figure 6:
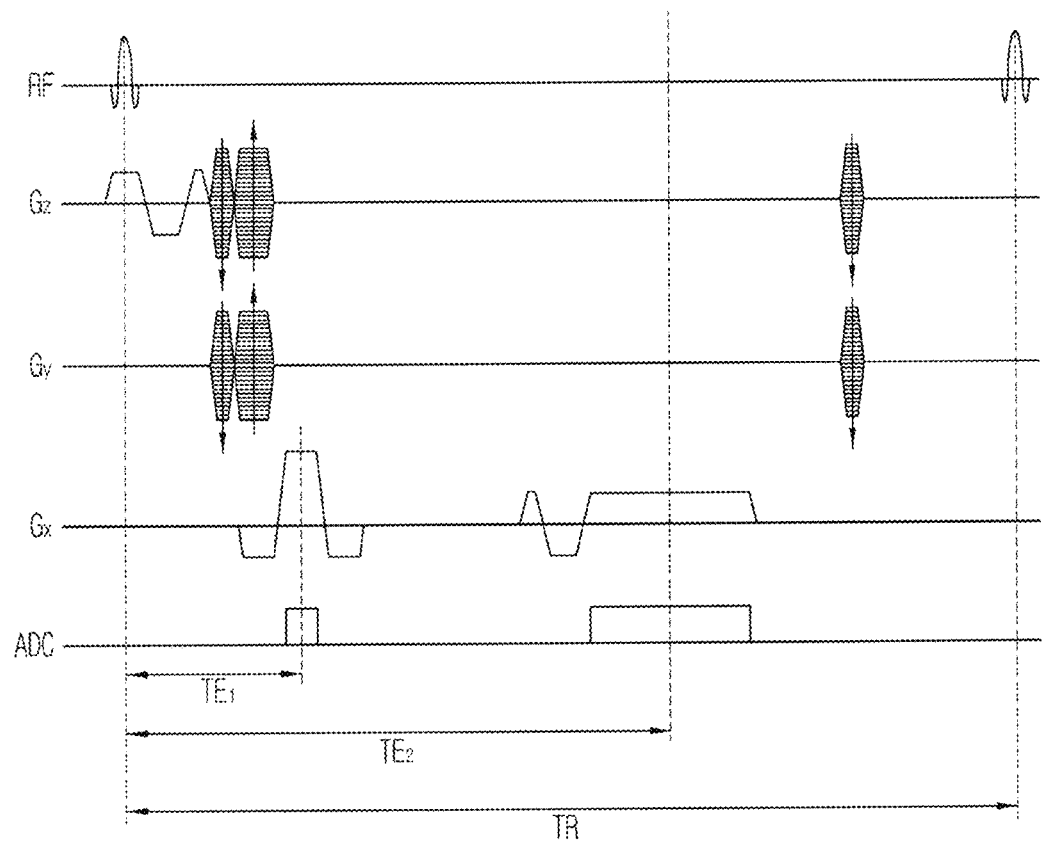
FIG. 6 shows a pulse sequence for acquiring a susceptibility-weighted image according to invention principles.
Figure 7:
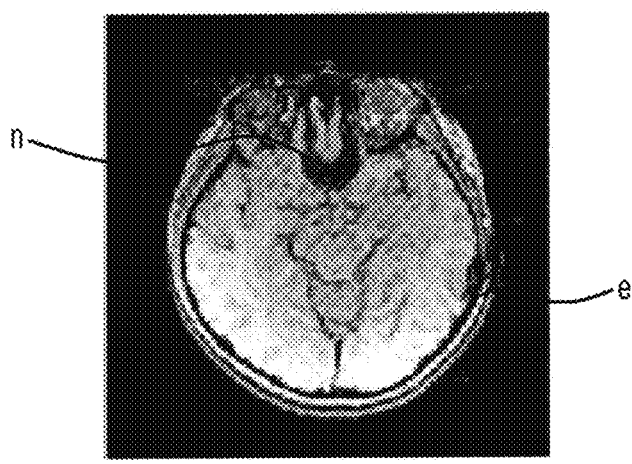
FIG. 7 shows a signal attenuation region according to weighting of susceptibility according to invention principles.
Figure 8:
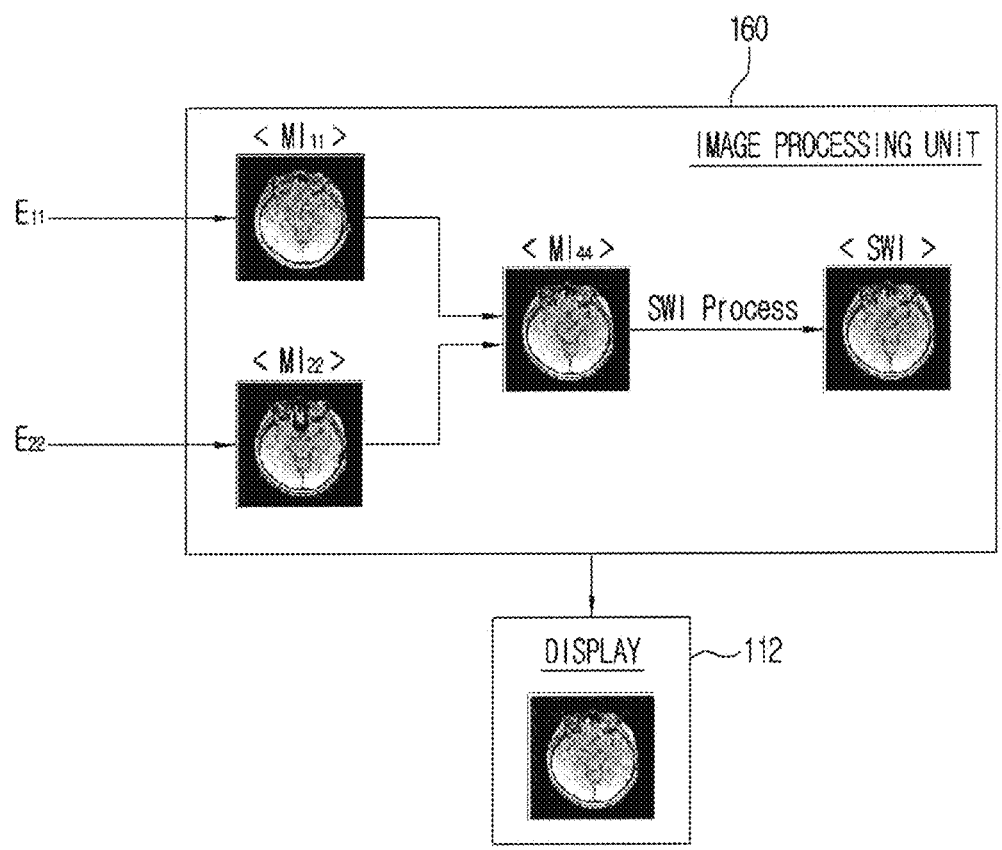
FIG. 8 shows a process of acquiring a susceptibility-weighted image by combining echo signals obtained from the pulse sequence shown in FIG. 6 according to invention principles.

FIG. 6 shows a gradient based pulse sequence for acquiring a susceptibility-weighted image, FIG. 7 shows an MRI image including signal attenuation region in response to susceptibility weighting, and FIG. 8 shows a method of acquiring a susceptibility-weighted image by combining echo signals obtained from the pulse sequence shown in FIG. 6.

In FIG. 6, a susceptibility-weighted image echo signal is acquired within a second time echo ($TE_2$) time. The second TE varies according to the strength of a main magnetic field applied to the target body 200. In general, the stronger the main magnetic field applied to the target body 200, the shorter the second TE time. Thus, the SWI method is more efficiently used in an MRI apparatus employing a high magnetic field. For example, the second TE of about 40 to 80 ms is necessary at 1.5 T, and the second TE of about 20 to 25 ms is necessary at 3 T.

When a magnetic resonance image is configured on the basis of the echo signal acquired in the second TE, the signal is attenuated in a region, and the region is shown dark-shaded as shown in FIG. 7. The region in which signal attenuation has occurred is referred to as a first region R1 described in connection with FIG. 12. An air cavity that is present in a nose or an ear causes susceptibility weighting and field inhomogeneity and thus the MR signal is attenuated in the air cavity. In the image shown in FIG. 7, the first region R1 in which the signal is attenuated due to a nasal cavity n and an ear canal e are shown dark-shaded. An echo signal is further acquired in a TE other than the second TE during a time repetition (TR) to compensate for signal attenuation shown in FIG. 7. Specifically, an echo signal is further acquired in a TE (other than the second TE) in which susceptibility weighting does not occur, and the acquired echo signal is used to compensate for signal attenuation.

Referring to FIG. 6 and FIG. 8, in a pulse sequence of the SWI method, a first echo signal E11 is acquired in a TE shorter than the second TE, that is, at a TE referred to as a first TE, and a second echo signal E22 is acquired in the second TE. In the first echo signal E11 susceptibility weighting does not occur, and thus MRI signal attenuation does not occur. Accordingly, by advantageously combining the first echo signal E11 acquired in the first TE and the second echo signal E22 acquired in the second TE, the system compensates for the signal attenuation region of the second echo signal E22 acquired in the second TE. Although a first TE is used in which susceptibility weighting does not occur, susceptibility weighting occurs in an echo signal acquired in a long TE, and a TE shorter than the second TE is selected as the first TE.

As shown in FIG. 8, when the respective echo signals, that is, the first echo signal E11 and the second echo signal E22, are acquired in the first TE and the second TE respectively, the image processing unit 160 acquires a first image I11 and a second image I22 from the first echo signal E11 and the second echo signal E22 respectively, and derives a corresponding first magnitude image MI11 and a second magnitude image MI22 from the first image I11 and the second image I22 respectively. Unit 160 advantageously derives a fourth magnitude image MI44 that is a magnitude image in which a signal attenuation region present in the second magnitude image MI22 has been compensated by combining the first magnitude image MI11 and the second magnitude image MI22. Unit 160 acquires MR signal frequency domain data from an echo signal for population of an image representative k-space data array, separates a magnitude image and a phase image from the acquired image representative data, calculates a phase mask using the phase image, and multiplies the magnitude image by the calculated phase mask n (natural number of 1 or more) times, thereby acquiring a susceptibility-weighted image. The image processing unit 160 acquires a susceptibility-weighted image compensated in the first region R1 (see FIG. 12) in which signal attenuation has occurred by multiplying the magnitude image MI44 and the determined phase mask and displays the acquired susceptibility-weighted image on the display 112.

Figure 9:
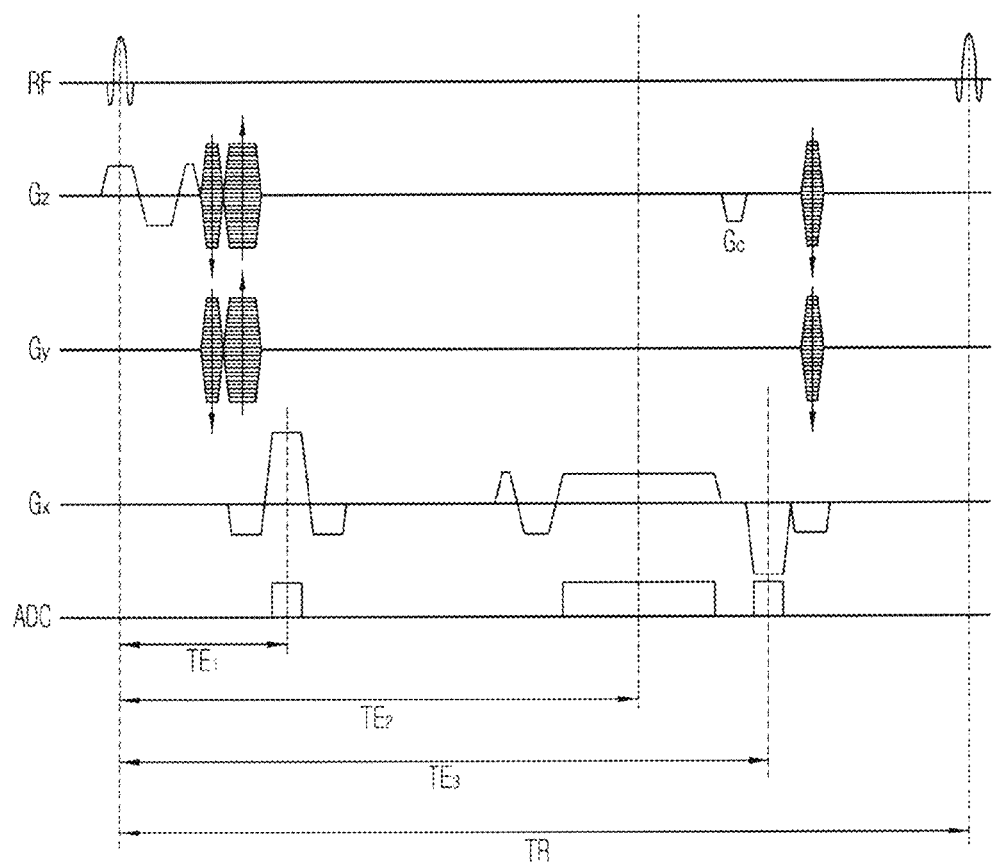
FIG. 9 shows a pulse sequence for acquiring a susceptibility-weighted image according to invention principles.
Figure 10:
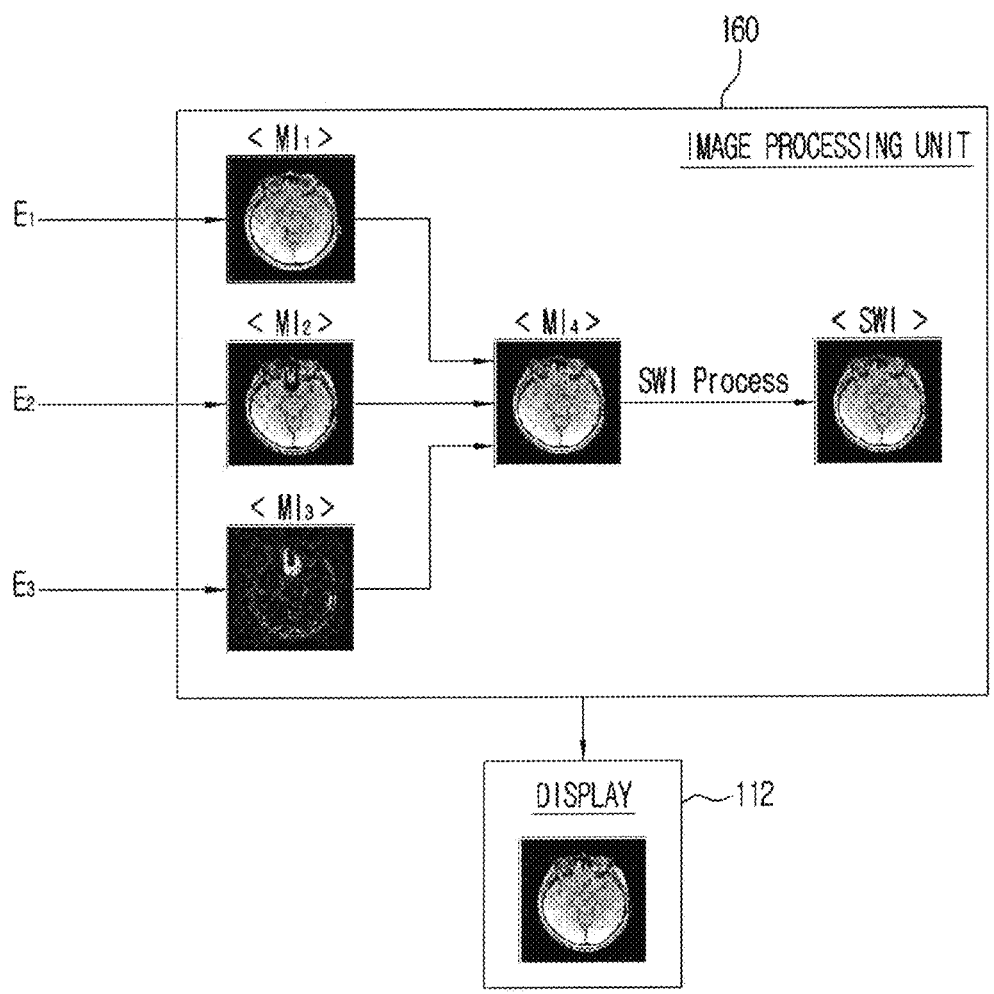
FIG. 10 shows a process of acquiring a susceptibility-weighted image by combining echo signals obtained from the pulse sequence shown in FIG. 9 according to invention principles.

FIG. 9 shows a gradient pulse sequence for acquiring a susceptibility-weighted image and FIG. 10 shows a process of acquiring a susceptibility-weighted image by combining data derived from echo signals obtained from the pulse sequence shown in FIG. 9. An RF echo signal used for deriving a susceptibility-weighted image is acquired in $TE_2$ referred to as a second TE. The MR signal is attenuated in a region appearing as a dark-shaded area due to nose and ear air cavities, for example, as shown in FIG. 7. In an SWI method, an echo signal is further acquired in a TE other than the second TE to compensate for signal attenuation shown in FIG. 7 as described in connection with FIG. 7. Referring to FIG. 9, in a pulse sequence of the SWI method in another embodiment, a first echo signal E1 is acquired in a TE shorter than the second TE, that is, a TE referred to as a first TE, a second echo signal E2 is acquired in the second TE, and a third echo signal E3 is acquired in a TE referred to as a third TE. In the first echo signal E1 acquired in the first TE shorter than the second TE, weighting of susceptibility does not occur, and thus signal attenuation that occurs in the second echo signal E2 acquired in the second TE is not shown. The third echo signal E3 acquired in the third TE is acquired after applying a compensation gradient field Gc for compensating for field inhomogeneity. The compensation gradient field Gc is applied using a z-axis gradient coil substantially immediately after the second echo signal E2 is acquired in the second TE.

Since the third echo signal E3 acquired in the third TE is acquired after applying the compensation gradient field Gc for compensating for field inhomogeneity, field compensation is achieved providing MR signal acquisition with reduced signal attenuation. The compensation gradient field Gc is selected to compensate for field inhomogeneity caused by weighting of susceptibility in an air cavity, and by acquiring images with and without the Gc compensation enables determination of whether signal attenuation is due to an air cavity or other reasons. Also, since the third TE is acquired after applying the compensation gradient field Gc for compensating for field inhomogeneity, it is preferable to select a TE longer than the second TE as the third TE.

As shown in FIG. 10, the image processing unit 160 derives a first image I1, a second image I2, and a third image I3 from the first echo signal E1, the second echo signal E2, and the third echo signal E3 respectively, and acquires first to third magnitude images MI1 to MI3 from the first to third images I1 to I3 respectively. The third magnitude image MI3, is analyzed by the image processing unit 160 (or a user) to determine whether signal attenuation of the second magnitude image MI2 is due to an air cavity based on anatomical location (e.g. ear, nose) of the attenuation. Further luminance attenuation is recognized by identifying lower average pixel luminance in an image area than expected or than neighboring similar tissue structures. Thereby, unit 160 determines whether MR signal attenuation is due to air cavities or other reasons, and compensates for the attenuation using the first magnitude image MI1, by generating a fourth magnitude image MI4 compensated for signal attenuation.

Image processing unit 160 populates a k-space data array with image representative data derived from an echo signal, separates a magnitude image and a phase image from the acquired image, calculates a phase mask using the phase image, and multiplies the magnitude image by the calculated phase mask n (natural number of 1 or more) times, thereby acquiring a susceptibility-weighted image. The image processing unit 160 acquires a susceptibility-weighted image compensated in for signal attenuation by multiplying the fourth magnitude image MI4 and a phase mask.

Figure 11:
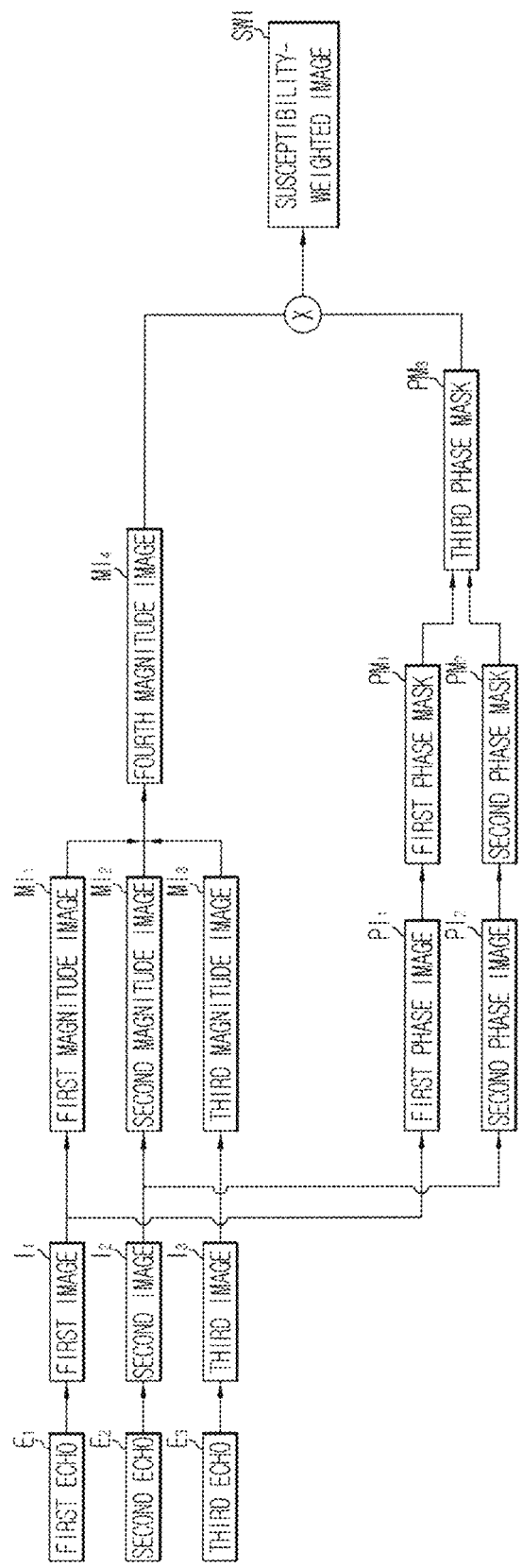
FIG. 11 shows acquiring a susceptibility-weighted image from echo signals obtained from the pulse sequence shown in FIG. 9 according to invention principles.
Figure 12:
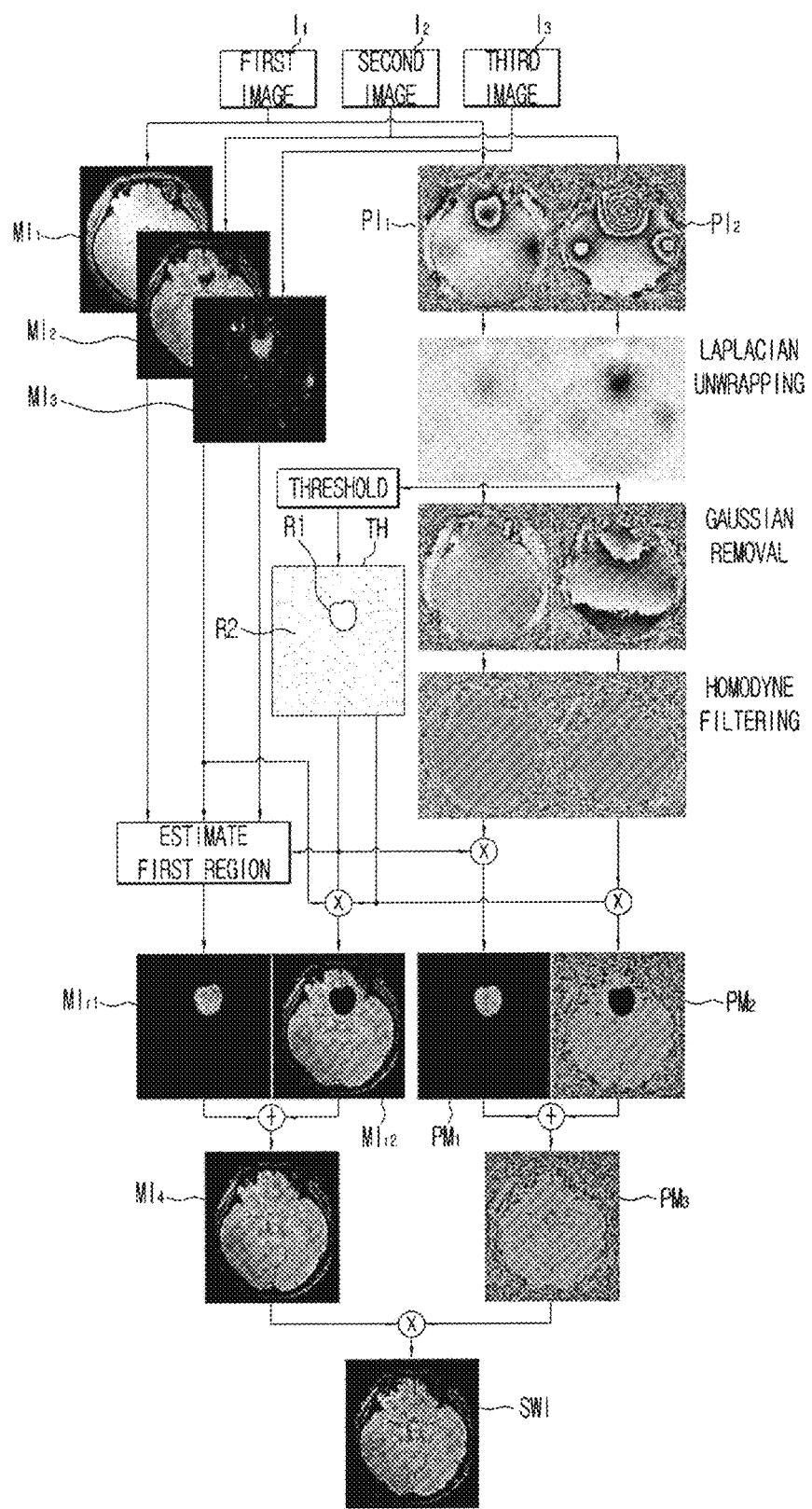
FIG. 12 shows the method of FIG. 9 in further detail according to invention principles.

FIG. 11 shows acquisition of a susceptibility-weighted image from RF echo signal data obtained using a pulse sequence shown in FIG. 9. FIG. 12 shows the process of FIG. 9 in further detail. In FIG. 11, shows a process of acquiring a susceptibility-weighted image from a first echo signal E1, a second echo signal E2, and a third echo signal E3 respectively acquired in a first TE, a second TE, and a third TE. Images are acquired from the first to third echo signals E1 to E3, and magnitude images and phase images are separated from the respective images. Specifically, first to third magnitude images MI1 to MI3 are separated from first to third images I1 to I3 acquired from the first to third echo signals E1 to E3, and first and second phase images PI1 and PI2 are separated from the first and second images I1 and I2 acquired from the first and second echo signals E1 and E2.

The separated first to third magnitude images MI1 to MI3 are combined to acquire a fourth magnitude image MI4 compensated for signal attenuation and the separated first and second phase images PI1 and PI2 are combined to acquire a third phase mask PM3 compensated for signal attenuation. The fourth magnitude image MI4 and the third phase mask PM3 compensated for signal attenuation are combined to acquire a compensated susceptibility-weighted image. The process illustrated in FIG. 11 will be described in further detail below with reference to FIG. 12.

As shown in FIG. 12, the magnitude images are respectively separated from the first image I1, the second image I2, and the third image I3 generated from the first echo signal E1, the second echo signal E2, and the third echo signal E3, and phase images are separated from the first image I1 and the second image I2, respectively. The first region R1 in which signal attenuation has occurred is present in the second magnitude image MI2, but is not present in the first magnitude image MI1. In the third magnitude image MI3, the first region R1 that is shown dark-shaded in the second magnitude image MI2 is shown bright due to application of a compensation gradient field Gc. The image processing unit 160 performs a process of estimating the first region R1 comprising the signal attenuation region using the first to third magnitude images MI1 to MI3. The image processing unit 160 estimates parameters necessary to estimate the first region R1 from the first to third magnitude images MI1 to MI3 using an iterative non-linear curve fitting algorithm, and identifies the first region R1. When the first region R1 is identified in this way, the image processing unit 160 compensates the identified first region R1 using the first magnitude image MI1, thereby acquiring a magnitude image MIr1 in which the first region R1 alone is shown bright. Also, a magnitude image MIr2 of a second region R2 that is a region other than the first region R1 in which signal attenuation has occurred is acquired from the second magnitude image MI2.

The image processing unit 160 combines the magnitude image MIr1 of the first region R1 and the magnitude image MIr2 of the second region R2 acquired through the above described process, to provide the fourth magnitude image MI4 in which the first region R1 having signal attenuation region has been compensated. Unit 160 uses the first to third magnitude images MI1 to MI3 to identify the first region R1 in which signal attenuation has occurred. In addition an image (referred to as a fourth image below) is acquired by performing thresholding on the second phase image PI2 and the second region R2. Unit 160 performs Laplacian unwrapping on the second phase image PI2, and performs thresholding on the Laplacian unwrapped image using a predetermined threshold value, for example, −4π, thereby acquiring a fourth image TH. The first attenuated region R1 image data values are divided by values of the fourth image TH. The fourth image TH is divided into the first region R1 and the second region R2 through thresholding to estimate the first region R1. Unit 160 uses information within a phase image to identify a first region R1 in which signal attenuation has occurred.

In addition, the image processing unit 160 acquires the magnitude image MIr2 of the second region R2 by combining data relating to the second region R2 of the fourth image TH divided into the first region R1 and the second region R2 through thresholding with the second magnitude image MI2. The fourth image TH divided into the first region R1 and the second region R2 through thresholding is used to estimate the first region R1 and acquire the magnitude image MIr2 of the second region R2, such that the first region R1 can be more efficiently estimated, and the magnitude image MIr2 of the second region R2 can be acquired.

Furthermore, the image processing unit 160 acquires a first phase mask PM1 in which the first region R1 is shown bright and a second phase mask PM2 in which the second region R2 is shown bright respectively from the first phase image PI1 and the second phase image PI2 separated from the first image I1 and the second image I2. The image processing unit 160 sequentially performs Laplacian unwrapping, Gaussian filtering, and homodyne filtering on each of the first phase image PI1 and the second phase image PI2, thereby acquiring the first phase mask PM1 and the second phase mask PM2. Unit 160 acquires the first and second phase masks PM1 and PM2 using the fourth image TH divided into the first region R1 in which signal attenuation has occurred and the second region R2 that is the other region by performing thresholding on the second phase image PI2 having undergone Laplacian unwrapping.

Image processing unit 160 combines the first phase image PI1 having undergone homodyne filtering and data of the first region R1 of the fourth image TH divided into the first region R1 and the second region R2 through thresholding, thereby acquiring the first phase mask PM1 in which the first region R1 is shown bright. Also, the image processing unit 160 combines the second phase image PI2 having undergone homodyne filtering and the data of the second region R2 of the fourth image TH, thereby acquiring the second phase mask PM2 in which the second region R2 is shown bright.

The image processing unit 160 combines the first phase mask PM1 in which the first region R1 is shown bright and the second phase mask PM2 in which the second region R2 is shown bright that are acquired through the above-described process, thereby acquiring the third phase mask PM3 in which the first region R1 having signal attenuation region has been compensated. Image processing unit 160 combines the fourth magnitude image MI4 in which the first region R1 that is the signal attenuation region has been compensated and the third phase mask PM3 in which the signal attenuation region has been compensated, thereby acquiring the susceptibility-weighted image in which the first region R1 has been compensated. the first region R1 of an image in which signal attenuation has occurred is compensated using both a magnitude image and a phase mask to reliably compensate signal attenuation due to an air cavity.

Figure 13:
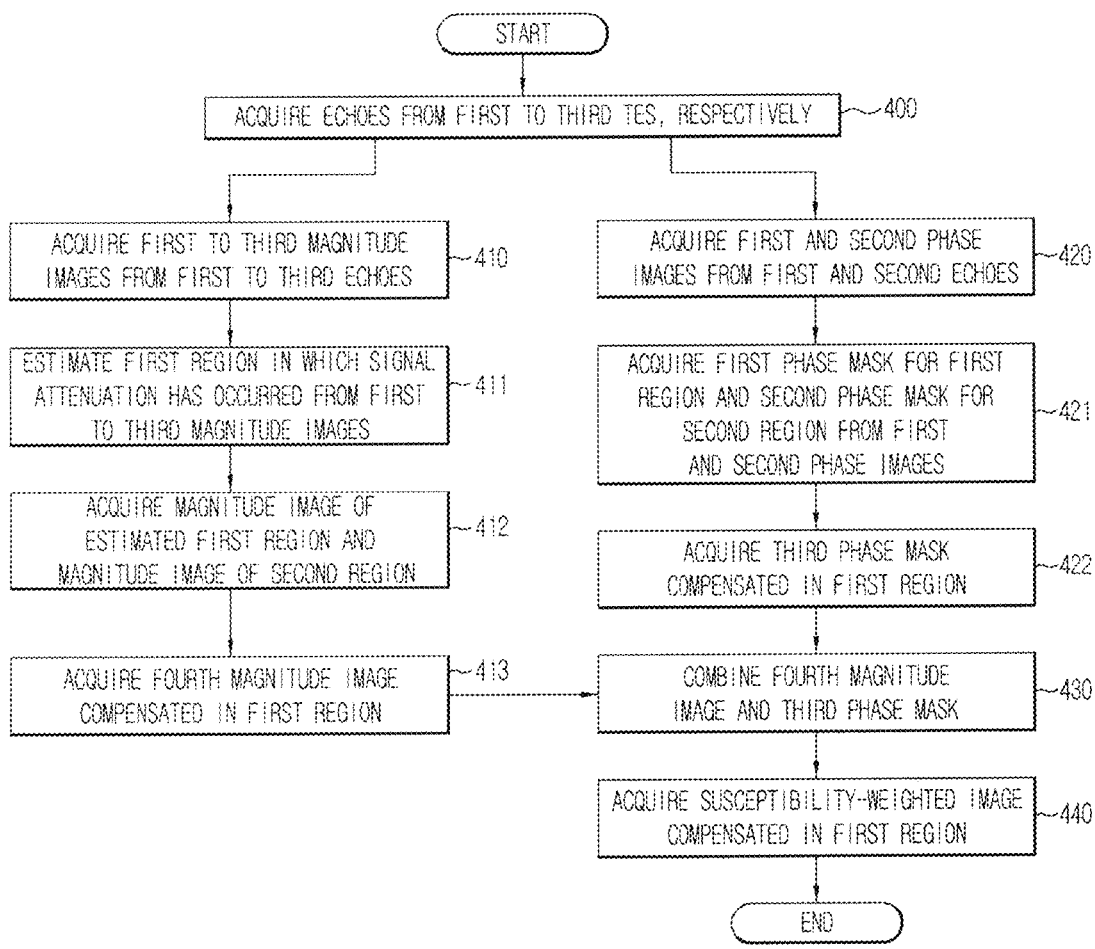
FIG. 13 shows a flowchart of a method for susceptibility-weighted imaging (SWI) according to invention principles.

FIG. 13 shows a flowchart of a method of providing SWI using first, second and third echo signals E1, E2 and E3 acquired in a first TE, a second TE and a third TE, respectively (400). The first echo signal E1 is acquired in a TE shorter than the second TE, that is, a TE referred to as the first TE, the second echo signal E2 is acquired in the second TE, and the third echo signal E3 is acquired in the third TE. In the first echo signal E1 acquired in the first TE shorter than the second TE, weighting of susceptibility does not occur, and thus signal attenuation that occurs in the second echo signal E2 acquired in the second TE is not shown. The third echo signal E3 is acquired in the third TE is acquired after applying a compensation gradient field Gc for compensating for field inhomogeneity. The compensation gradient field Gc is applied from a z-axis gradient coil immediately after the second echo signal E2 is acquired in the second TE.

When the echo signals are acquired, the image processing unit 160 acquires magnitude images from the echo signals respectively (410), and acquires phase images (420). The image processing unit 160 acquires first to third images I1 to I3 from respective k-space data generated from the first to third echo signals E1 to E3 acquired in the first to third TEs, separates first to third magnitude images MI1 to MI3 from the first to third images I1 to I3, and separates first and second phase images PI1 and PI2 from the first and second images I1 and I2. When the first to third images MI1 to MI3 are separated, the image processing unit 160 estimates a first region R1 in which signal attenuation has occurred from the first to third magnitude images MI1 to MI3 (411), and acquires a magnitude image MIr1 of the estimated first region and a magnitude image MIr2 of a second region R2 (412).

The first region R1 in which signal attenuation has occurred is present in the second magnitude image MI2, but is not present in the first magnitude image MI1. In the third magnitude image MI3, the first region R1 that is shown dark-shaded in the second magnitude image MI2 is shown bright due to application of the compensation gradient field Gc. The image processing unit 160 performs a process of estimating the first region R1 that is the signal attenuation region using the first to third magnitude images MI1 to MI3. The image processing unit 160 determines parameters that are used to identify the first region R1 from the first to third magnitude images MI1 to MI3 using an iterative non-linear curve fitting algorithm, and determine the first region R1. When the first region R1 is identified, the image processing unit 160 compensates the identified first region R1 using the first magnitude image MI1, thereby acquiring a magnitude image MIr1 in which the first region R1 alone is shown bright.

Also, the magnitude image MIr2 of the second region R2 that is a region other than the estimated first region R1 is acquired from the second magnitude image MI2. The image processing unit 160 uses the first to third magnitude images MI1 to MI3 to identify the first region R1 in which signal attenuation has occurred In addition to these images, a fourth image is derived and used in divided into the first region R1 acquired by performing thresholding on the second phase image PI2 and the second region R2 is used together. More specifically, the image processing unit 160 performs Laplacian unwrapping on the second phase image PI2, and performs thresholding on the image having undergone Laplacian unwrapping using a predetermined value, for example, $-4\pi$, thereby acquiring the fourth image TH divided into the first region R1 in which signal attenuation has occurred and the second region R2 that is the region other than the first region R1. The fourth image TH divided into the first region R1 and the second region R2 through thresholding in this way is used to estimate the first region R1. Unit 160 uses information derived from a phase image, in identifying the first region R1 in which signal attenuation has occurred.

In addition, the image processing unit 160 acquires the magnitude image MIr2 of the second region R2 by combining data relating to the second region R2 of the fourth image TH divided into the first region R1 and the second region R2 through thresholding with the second magnitude image MI2. The fourth image TH divided into the first region R1 and the second region R2 through thresholding in order to identify the first region R1 and acquire the magnitude image MIr2 of the second region R2. When the magnitude image MIr1 of the first region R1 and the magnitude image MIr2 of the second region R2 are acquired, the image processing unit 160 acquires a fourth magnitude image MI4 in which the first region R1 has been compensated (413).

The image processing unit 160 combines the magnitude image MIr1 of the first region R1 and the magnitude image MIr2 of the second region R2 acquired through the above described process, thereby acquiring the fourth magnitude image MI4 in which the first region R1 has been compensated for signal attenuation. When the first and second phase images PI1 and PI2 are acquired, the image processing unit 160 acquires a phase mask for the first region R1 and a phase mask for the second region R2 from the first and second phase images PI1 and PI2 (421). The image processing unit 160 acquires a first phase mask PM1 in which the first region R1 is shown bright and a second phase mask PM2 in which the second region R2 is shown bright respectively from the first phase image PI1 and the second phase image PI2 separated from the first image I1 and the second image I2.

The image processing unit 160 sequentially performs Laplacian unwrapping, Gaussian filtering, and homodyne filtering on each of the first phase image PI1 and the second phase image PI2, thereby acquiring the first phase mask PM1 and the second phase mask PM2. Unit 160 acquires the first and second phase masks PM1 and PM2, using the fourth image TH divided into the first region R1 in which signal attenuation and by performing thresholding on the second phase image PI2 having undergone Laplacian unwrapping. Unit 160 combines the first phase image PI1 having undergone homodyne filtering of the first region R1 data of the fourth image TH divided into the first region R1 and the second region R2 through thresholding, thereby acquiring the first phase mask PM1 in which the first region R1 is shown bright. Also, the image processing unit 160 combines the second phase image PI2 having undergone homodyne filtering of the second region R2 data of the fourth image TH, thereby acquiring the second phase mask PM2 in which the second region R2 is shown bright.

When the phase mask for the first region R1 and the phase mask for the second region R2 are acquired, the image processing unit 160 acquires a third phase mask PM3 in which the first region R1 has been compensated (422). The image processing unit 160 combines the first phase mask PM1 in which the first region R1 is shown bright and the second phase mask PM2 in which the second region R2 is shown bright to provide the third phase mask PM3 in which the first region R1 signal attenuation has been compensated. The image processing unit 160 combines the fourth magnitude image MI4 in which the first region R1 signal attenuation has been compensated and the third phase mask PM3 in which the first region R1 signal attenuation has been compensated (430), to provide a an attenuation compensated susceptibility-weighted image (440). Unit 160 compensates signal attenuation of the first region R1 of an image using both a magnitude image and a phase mask.

Although a few embodiments of the present invention have been shown and described, it would be appreciated by those skilled in the art that changes is made in these embodiments without departing from the principles and spirit of the invention, the scope of which is defined in the claims and their equivalents.

The above-described embodiments can be implemented in hardware, firmware or via the execution of software or computer code that can be stored in a recording medium such as a CD ROM, a Digital Versatile Disc (DVD), a magnetic tape, a RAM, a floppy disk, a hard disk, or a magneto-optical disk or computer code downloaded over a network originally stored on a remote recording medium or a non-transitory machine readable medium and to be stored on a local recording medium, so that the methods described herein can be rendered via such software that is stored on the recording medium using a general purpose computer, or a special processor or in programmable or dedicated hardware, such as an ASIC or FPGA. As would be understood in the art, the computer, the processor, microprocessor controller or the programmable hardware include memory components, e.g., RAM, ROM, Flash, etc. that may store or receive software or computer code that when accessed and executed by the computer, processor or hardware implement the processing methods described herein. In addition, it would be recognized that when a general purpose computer accesses code for implementing the processing shown herein, the execution of the code transforms the general purpose computer into a special purpose computer for executing the processing shown herein. The functions and process steps herein may be performed automatically or wholly or partially in response to user command. An activity (including a step) performed automatically is performed in response to executable instruction or device operation without user direct initiation of the activity. No claim element herein is to be construed under the provisions of 35 U.S.C. 112, sixth paragraph, unless the element is expressly recited using the phrase "means for."

DEFINITIONS

T1 comprises the longitudinal (or spin-lattice) relaxation time T1 decay constant.

T2 comprises the transverse (or spin-spin) relaxation time T2 is the decay constant for a proton spin component.

TR comprises repetition time, the time between successive RF excitation pulses.

TE (Echo Time) comprises a time period between the start of an RF pulse and a maximum in a received echo signal. The sequence is repeated every TR seconds.

What is claimed is:

1. A Susceptibility Weighting Imaging (SWI) method for acquiring a susceptibility-weighted image for use by a magnetic resonance imaging (MRI) system, comprising:
    acquiring a first RF echo signal in a first echo time for providing an image exclusive of susceptibility-weighting;
    acquiring a second RF echo signal in a second echo time longer than the first echo time for providing an image including susceptibility-weighting;
    applying a compensation gradient field for compensating for field inhomogeneity;
    in response to applying the compensation gradient field, acquiring a third RF echo signal in a third echo time longer than the second echo time;
    generating first, second and third images in response to data derived from the first, second and third RF echo signals respectively;
    compensating a first region in which magnetic resonance signal attenuation has occurred in the second image by combining the first, second and third images;
    deriving first, second and third magnitude images from the first, second and third images respectively, and deriving first and second phase images from the first and second images;
    identifying the first region using the first, second and third magnitude images;
    acquiring a magnitude image of the identified first region; and
    calculating a magnitude image of a second region excluding the first region in response to the second magnitude image.

2. The SWI method according to claim 1, wherein the first, second and third RF echo signals are acquired within a single repetition time (TR) between successive RF excitation pulses.

3. The SWI method according to claim 1, further comprising:
    thresholding the second phase image to acquire a fourth image divided into the first region and a second region excluding the first region from the second phase image; and
    identifying the first region using the first, second and third magnitude images and the fourth image.

4. The SWI method according to claim 3, further comprising acquiring a magnitude image of the second region using the second magnitude image and the fourth image.

5. The SWI method according to claim 1, further comprising combining the magnitude image of the first region and the magnitude image of the second region to acquire a fourth magnitude image compensated for signal attenuation.

6. The SWI method according to claim 3, further comprising:
    acquiring a first phase mask for the first region using the first phase image and the fourth image;
    acquiring a second phase mask for the second region using the second phase image and the fourth image; and
    combining the first phase mask and the second phase mask to acquire a third phase mask compensated for signal attenuation.

7. The SWI method according to claim 6, wherein acquiring the first phase mask and the second phase mask includes:
    performing Laplacian unwrapping on each of the first phase image and the second phase image;
    performing Gaussian filtering on each of the Laplacian unwrapped first phase image and the second phase image; and
    performing homodyne filtering on each of the Gaussian filtered first phase image and the second phase image.

8. The SWI method according to claim 5, further comprising combining the fourth magnitude image compensated for signal attenuation and a third phase mask compensated for signal attenuation to acquire the susceptibility-weighted image compensated for signal attenuation.

9. The SWI method according to claim 1, wherein the first region includes a region in which signal attenuation has been caused by susceptibility weighting associated with an air cavity.

10. A Susceptibility Weighting Imaging (SWI) method for acquiring a susceptibility-weighted image for use by a magnetic resonance imaging (MRI) system, comprising:

acquiring a first RF echo signal in a first echo time for providing an image exclusive of susceptibility-weighting;

acquiring a second RF echo signal in a second echo time longer than the first echo time for providing an image including susceptibility-weighting;

acquiring a third RF echo signal in a third echo time longer than the second echo time;

deriving data representing first, second and third images from the first, second and third echo signals respectively, and identifying a first region in which signal attenuation has occurred in the second image using the acquired first, second and third images;

compensating the first region by combining first, second and third images;

deriving first, second and third magnitude images from the first, second and third images respectively, and deriving first and second phase images from the first and second images;

identifying the first region using the first to third magnitude images; and acquiring a magnitude image of the identified first region and calculating a magnitude image of a second region excluding the first region using the second magnitude image.

11. The SWI method according to claim 10, wherein the first, second and third RF echo signals are acquired within a single repetition time (TR) between successive RF excitation pulses.

12. The SWI method according to claim 10, further comprising:

performing thresholding on the second phase image to acquire a fourth image divided into the first region and a second region excluding the first region from the second phase image; and identifying the first region using the first, second and third magnitude images and the fourth image.

13. The SWI method according to claim 12, further comprising acquiring a magnitude image of the second region using the second magnitude image and the fourth image.

14. The SWI method according to claim 10, further comprising combining the magnitude image of the first region and the magnitude image of the second region to acquire a fourth magnitude image compensated for signal attenuation.

15. The SWI method according to claim 12, further comprising:

acquiring a first phase mask for the first region using the first phase image and the fourth image;

acquiring a second phase mask for the second region using the second phase image and the fourth image; and combining the first phase mask and the second phase mask to acquire a third phase mask compensated for signal attenuation.

16. The SWI method according to claim 15, wherein acquiring the first phase mask and the second phase mask includes:

performing Laplacian unwrapping on each of the first phase image and the second phase image;

performing Gaussian filtering on each of the Laplacian unwrapped first phase image and the second phase image; and performing homodyne filtering on each of the Gaussian filtered first phase image and the second phase image.

17. The SWI method according to claim 14, further comprising combining the fourth magnitude image compensated for signal attenuation and a third phase mask compensated for signal attenuation to acquire the susceptibility-weighted image compensated for signal attenuation.

18. The SWI method according to claim 10, further comprising, when the second echo signal is acquired in the second echo time, applying a compensation gradient field for compensating for field inhomogeneity, and acquiring the third echo signal in the third echo time.

19. A magnetic resonance imaging (MRI) apparatus, comprising:

a radio frequency (RF) coil configured to, acquire a first RF echo signal in a first echo time for providing an image exclusive of susceptibility-weighting, acquire a second RF echo signal in a second echo time longer than the first echo time for providing an image including susceptibility-weighting and acquire a third RF echo signal in a third echo time longer than the second echo time; and an image processing unit configured to, derive data representing first, second and third images from the first, second and third echo signals respectively, identify a first region in which signal attenuation has occurred in the second image using the acquired first, second and third images, and compensate for attenuation of magnetic resonance signal in the identified first region by combining data of the first, second and third images, wherein the image processing unit derives first, second and third magnitude images from the first, second and third images respectiviely, derives first and second phase images from the first and second images, identifies the first region using the first, second and third magnitude images, and acquires a magnitude image of the identified first region and acquires a magnitude image of a second region excluding the first region using the second magnitude image.

20. The MRI apparatus according to claim 19, wherein the first, second and third RF echo signals are acquired within a single repetition time (TR) between successive RF excitation pulses.

21. The MRI apparatus according to claim 19, wherein the image processing unit performs thresholding on the second phase image to acquire a fourth image divided into the first region and a second region excluding the first region from the second phase image, and identifies the first region using the first, second and third magnitude images and the fourth image.

22. The MRI apparatus according to claim 21, wherein the image processing unit acquires a magnitude image of the second region using the second magnitude image and the fourth image.

23. The MRI apparatus according to claim 19, wherein the image processing unit combines the magnitude image of the first region and the magnitude image of the second region to acquire a fourth magnitude image compensated for signal attenuation.

24. The MRI apparatus according to claim 21, wherein the image processing unit acquires a first phase mask for the first region using the first phase image and the fourth image, acquires a second phase mask for the second region using the second phase image and the fourth image, and acquires a third phase mask compensated for signal attenuation by combining the first phase mask and the second phase mask.

25. The MRI apparatus according to claim 24, wherein the image processing unit performs Laplacian unwrapping on each of the first phase image and the second phase image to provide unwrapped images, performs Gaussian filtering on each of the Laplacian unwrapped first and second phase images, and performs homodyne filtering on each of the Gaussian filtered, first phase image and the second phase image.

26. The MRI apparatus according to claim 23, wherein the image processing unit combines the fourth magnitude image compensated for signal attenuation and a third phase mask compensated for signal attenuation to acquire a susceptibility-weighted image compensated for signal attenuation.

27. The MRI apparatus according to claim 19, further comprising a gradient coil configured to apply a compensation gradient field for compensating for field inhomogeneity when the second echo signal is acquired in the second echo time, wherein the RF coil acquires the third echo signal in the third echo time in response to applying the compensation gradient field.

* * * * *